(12) United States Patent
Kawasumi

(10) Patent No.: US 7,173,457 B2
(45) Date of Patent: Feb. 6, 2007

(54) SILICON-ON-INSULATOR SENSE AMPLIFIER FOR MEMORY CELL

(75) Inventor: Atsushi Kawasumi, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 9 days.

(21) Appl. No.: 10/906,036

(22) Filed: Jan. 31, 2005

(65) Prior Publication Data
US 2006/0170460 A1    Aug. 3, 2006

(51) Int. Cl.
*G01R 19/00* (2006.01)
*G11C 7/00* (2006.01)
*H03F 3/45* (2006.01)

(52) U.S. Cl. ...................................... 327/55
(58) Field of Classification Search ............ 327/51–52, 327/55, 57, 534; 365/205, 207, 208
See application file for complete search history.

(56) References Cited

U.S. PATENT DOCUMENTS

| | | | |
|---|---|---|---|
| 5,508,644 A * | 4/1996 | Branson et al. ................ 327/57 |
| 5,949,256 A * | 9/1999 | Zhang et al. .................. 327/57 |
| 6,331,791 B1 * | 12/2001 | Huang .......................... 326/98 |
| 6,433,589 B1 * | 8/2002 | Lee .............................. 326/115 |
| 6,442,090 B1 * | 8/2002 | Ahmed et al. ............... 365/207 |
| 6,480,037 B1 * | 11/2002 | Song et al. .................... 327/55 |
| 6,833,737 B2 * | 12/2004 | Aipperspach ................. 327/55 |
| 7,046,045 B2 * | 5/2006 | Nakazato et al. ............. 327/55 |
| 7,053,668 B2 * | 5/2006 | Nakazato et al. ............. 327/55 |

OTHER PUBLICATIONS

Marshall, A. et al., SOI Design: Analog, Memory and Digital Techniques, ISBN 0-7923-7640-4, Chapter 8.6, pp. 197-200.
Bernstein, K. et al., SOI Circuit Design Concepts, ISBN 0-7923-7762-1, Chapter 6.4, pp. 131-137.
Bernstein, K. et al., SOI Circuit Desing Concepts, ISBN 0-7923-7762-1, Chapter 6.4, pp. 124-128.

* cited by examiner

*Primary Examiner*—My-Trang Nu Ton
(74) *Attorney, Agent, or Firm*—Stephen B. Parker; Watchstone P+D, plc

(57) ABSTRACT

A silicon-on-insulator (SOI) sense amplifier for sensing bit values stored in a memory cell, includes first and second input field effect transistors (FETs), connected to first and second cross-coupled CMOS inverter FET pairs. The input FETs are implemented as floating body FETs, which decreases gate capacitances and increases sense operation speed. History effect problems are minimized as threshold voltage differences are kept small.

12 Claims, 1 Drawing Sheet saout body

US 7,173,457 B2

SILICON-ON-INSULATOR SENSE AMPLIFIER FOR MEMORY CELL

FIELD OF THE INVENTION

The present invention relates generally to solid state memory devices, such as semiconductor memory arrays, and more particularly to memory cell output sense amplifier circuits for such arrays.

BACKGROUND OF THE INVENTION

The insulated-gate field-effect transistor (IGFET) has been arranged in various configurations of bistable stages, or cells, resembling bipolar transistor flip-flops. Unlike a conventional bipolar junction transistor, in which both majority and minority carriers are required for operation, an IGFET is a unipolar transistor to the extent that only majority carriers are required for operation. Conduction in an IGFET device is controlled by signals applied to a control electrode, without any current flow between the control electrode and controlled electrodes because the control electrode in insulated from the controlled electrodes. IGFET memory cells consume significantly less power than bipolar transistor cells.

Individual memory cells are addressed by data input and output lines, with each memory cell commonly having two output bit lines (e.g., a bit line BL and a complementary bit line /BL) for indicating the existence of a "0" or "1" bit stored in the memory cell. The "0" and "1" bits are represented by different voltages that are of small magnitude and are subject to errors over time that tend to reduce the difference between the respective voltages. Therefore, it is conventional practice to provide sense amplifiers connected to the output bit lines of a memory cell, which are adapted to accurately detect or "sense" the small voltage differences between the bit lines and to amplify such differences so as to latch the bit value indicated thereby to provide a more accurate read out.

A conventional sense amplifier includes cross-coupled field effect transistor pairs (FETs) each having a first current carrying electrode (source or drain electrode) coupled to a respective one of the bit lines via an input switch, and gate electrodes cross-coupled to each other and to respective output terminals of the sense amplifier circuit. A sense amplifier enabling (SAE) FET receives a control signal which permits or prevents turning ON of the transistors. The signal to be sensed appears on only one of the bit lines, which then carries a voltage higher or lower than the other bit line, depending on the value of the sensed signal. Consequently, when the control signal is applied to the connected SAE FET to permit turn ON of the two transistors, the transistor having its gate electrode coupled to the bit line carrying the higher voltage will turn ON first. The other transistor will thereafter be maintained in its off state to latch the information read out from the memory cell.

However, the sensitivity of such a sense amplifier depends critically on the threshold voltage $V_{th}$ of each field effect transistor. If the threshold voltage of the transistor which is intended to turn ON first becomes significantly larger than the threshold voltage of the other transistor, the other transistor will turn ON instead of the first transistor, resulting in an erroneous read operation. The development of integration and miniaturization techniques has made the possible variation or divergence in threshold voltages among FETs correspondingly larger. The resulting increased possibility of sensing errors is a significant concern in the further optimization of memory array structures.

Silicon-on-insulator (SOI) technology has been used for the manufacture of FETs to improve (i.e., reduce) gate delay. As its name implies, SOI technology involves the formation of semiconductor devices in silicon layers that completely overlie an insulator layer. SOI technology has improved performance characteristics by reducing parasitic capacitances in semiconductor devices. As known in the art, because of the presence of an insulator layer on the surface of a semiconductor layer, body contacts are used to ground such FETs in order to avoid the so-called "history effect," whereby SOI FETs receiving many logic ones over a period of time tend to become biased in a given direction and thus require a much longer time than typical or desired to react to a logic zero input because of the resulting mismatch in threshold voltage $V_{th}$.

FIG. 2 shows an example sense amplifier according to the conventional art. Cross-coupled transistor pairs 104–106 include P-channel FETs (field effect transistors) 104 and 105, and N-channel FETs 106 and 107, coupled in a CMOS (complementary metal oxide semiconductor) inverter fashion. FETs 104 and 105 each have their source terminal connected to a positive voltage designated as Vdd.

N-channel FETs 101 and 102 are input transistors for the sense amplifier. FET 101 receives at input terminal IN a voltage from a bit line of a memory storage cell. FET 102 receives at complementary input terminal /IN a voltage from a complementary bit line of the memory storage cell. N-channel FET 103 is shown having a SAE (Sense Amplifier Enable) signal supplied to a gate thereof.

As known to those skilled in the art, P-type FETs turn ON to allow current flow from source to drain when the gate terminal is at a low or negative potential with respect to the source. When the gate potential is positive or the same as the source, the P-type FET is OFF, and does not conduct current. On the other hand, N-type FETs turn ON to allow current flow from source to drain when the gate terminal is high or positive with respect to the source. When the gate potential is negative or the same as the source, the N-type FET is OFF, and does not conduct current.

Output terminal $SA_{out}$ is connected to the drain terminals of FETs 105 and 107, and to the gate terminals of FETs 104 and 106. Complementary output terminal $/SA_{out}$ is connected to the drain terminals of FETs 104 and 106, and to the gate terminals of FETs 105 and 107. Input FETs 101 and 102 have grounded body contacts 110.

In operation, the sense amplifier circuit as shown in FIG. 2 detects a voltage difference between signals inputted to input terminals IN and /IN from a corresponding bit line and complementary bit line as stored in a memory cell. When an enable signal is sent to sense amplifier enable terminal SAE, FET 103 is turned ON and couples the circuit to ground, such that current begins to flow through the FETs 101 and 102 connected to receive bit lines signals at gates IN and/IN. In the example where a logic "0" is read from a memory cell, gate IN will have a lower input voltage than gate /IN at the time SAE turns on FET 103. Thus, FET 101 initially will conduct less current than FET 102, and, as a result, FET 106 will not pull down terminal /SAout as much as FET 102 pulls down terminal SAout.

As a result, the voltage at node SAout will fall faster than that at node /SAout. As the voltage at SAout falls, it will begin to shut off FET 106, and thereby causing even more current to pull down the voltage at SAout. When FET 106 is OFF, FET 104 will turn ON and cause node /SAout to return to a high level. Thus, the sense amplifier depends upon the current regulation abilities of input signal FETs 101 and 102. As previously mentioned, to avoid a problem caused by the history effect where the body of the FET becomes biased in a given direction, body contacts 110 are provided to tie the body of the FETs 101 and 102 to ground.

However, the gate capacitance of a body-tied FET is much larger than that of a floating body FET. This larger capacitance results in an undesirably slow transition time. Consequently, there remains a need in the art for improvement in sense amplifier configurations to reduce or eliminate these shortcomings.

SUMMARY OF THE INVENTION

The present invention eliminates the shortcomings in the background art and provides a significant advance in the art, by providing an improved silicon-on-insulator (SOI) sense amplifier According to one embodiment, the present invention provides a sense amplifier, including first and second CMOS FET inverter pairs, each pair having gate electrodes thereof coupled to a node between FETs of the other pair, a sense amplifier enabling FET, which receives a sense amplifier enable signal for enabling a sense operation of the sense amplifier, a first sense amplifier input FET, having a first electrode coupled to the first CMOS inverter pair, and a second electrode coupled to the sense amplifier enabling FET, and a second sense amplifier input FET, having a first electrode coupled to the second CMOS inverter pair, and a second electrode coupled to the sense amplifier enabling FET, wherein said first and second sense amplifier input FETs are floating body FETs.

In some embodiments, the NMOS transistors of the CMOS inverter pairs include body contacts coupling bodies of the NMOS transistors to ground.

In some embodiments, the sense amplifier is a silicon-on-insulator (SOI) sense amplifier.

In some embodiments, node voltages of the first and second sense amplifier input FETs are substantially identical during a sense operation.

In some embodiments, variation between body voltages of the first and second sense amplifier input FETs during a sense operation is relatively small.

In some embodiments, the first and second sense amplifier input FETs are NMOS transistors.

According to another aspect of the invention, a method of increasing sense operation speed of a sense amplifier is provided, including the step of implementing first and second sense amplifier input FETs as floating body FETs.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims.

BRIEF DESCRIPTION OF THE DRAWINGS

The various embodiments of the present invention are shown by way of example, and not limitation, in the accompanying figures, in which.

DETAILED DESCRIPTION OF THE EMBODIMENTS

While the present invention may be embodied in many different forms, a number of illustrative embodiments are described herein with the understanding that the present disclosure is to be considered as providing examples of the principles of the invention and that such examples are not intended to limit the invention to illustrative embodiments described herein and/or illustrated herein.

The present invention solves the problems in the background art by providing a SOI sense amplifier that uses floating body FETs at the input transistors of the sense amplifier, where previously, as in the conventional art, body-tied FETs were used.

The present inventor has discovered that, where the resistance of the body of the sense amplifier FET is large, even if the body of the FET is tied to ground (i.e., grounded), the body of the FET is virtually floating because of the large resistance value thereof. In this case, the resulting large gate capacitance restricts the performance of the sense amplifier.

According to the present invention, it is observed that the "history effect" is determined by the body voltage of the FET. The body voltage in turn is determined by the input voltages at the gate, source and drain nodes of the FET. When the gate, source and drain voltages are identical between two FETs, the same history effect will be observed on each of those two FETs over a sufficient time period. Even if the voltages were not identical but close enough to each other, the difference in observed history effect between the two FETs is substantially small.

Figure 1:
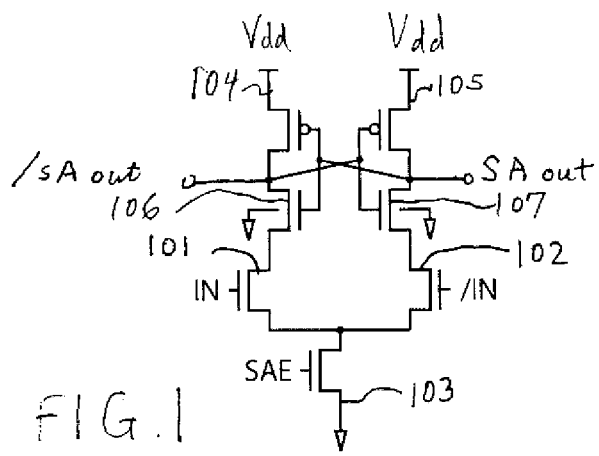
FIG. 1 is a circuit diagram of a SOI sense amplifier according to an embodiment of the present invention.
Figure 2:
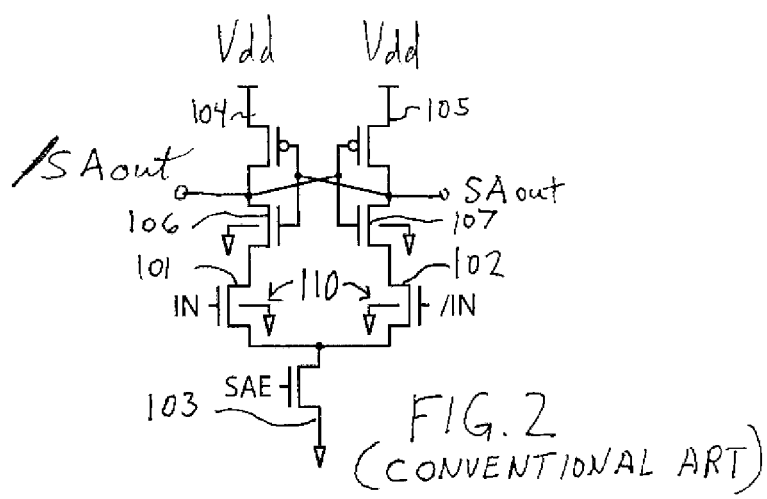
FIG. 2 is a circuit diagram of a SOI sense amplifier of the conventional art.

Thus, according to the invention, as shown in FIG. 1, the sense amplifier input transistors 101 and 102 are implemented as floating body FETs, instead of the conventional use of body-tied FETS having body contacts 110 tied to ground as shown in FIG. 2. This change from the conventional art does not significantly affect the offset voltage difference, for the reason that the gate, source and drain voltages of the input FETs 101 and 102 are almost identical (if not identical) during a sense operation. As a result, the gate capacitance of the FETs 101 and 102 is reduced, thereby increasing the drivability of the FETs 101 and 102 and improving the speed of the sensing operation.

Figure 3:
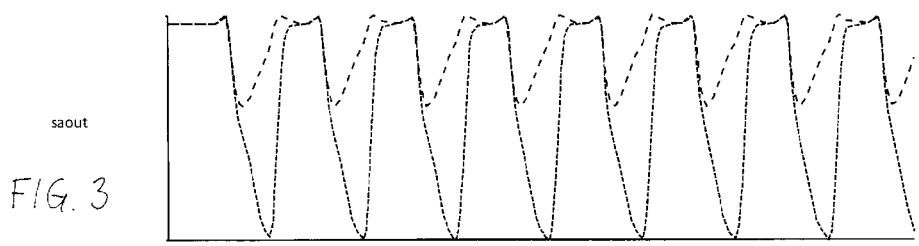
FIG. 3 is a current waveform illustrating the output transitions of SOI sense amplifier output terminal SAout, for body-tied FET and floating body FET.

FIG. 3 illustrates waveforms of sense amplifier output signal, for the case where the body of the sense amplifier FETs are tied to ground, and where the body of the sense amplifier FETs are made floating according to the present invention.

The case where the sense amplifier FET bodies are tied to ground is shown by the smaller dashed line in FIG. 3. As illustrated, where the FETs 101 and 102 are body-tied, the history effect is reduced, but the transition time between a "0" read out and a "1" read out is undesirably increased. On the other hand, the case where the sense amplifier FET bodies are made floating is shown by the larger dashed line in FIG. 3. As illustrated, where the bodies of FETs 101 and 102 are floating, the transition time between a "0" read out and a "1" read out is reduced.

Figure 4:
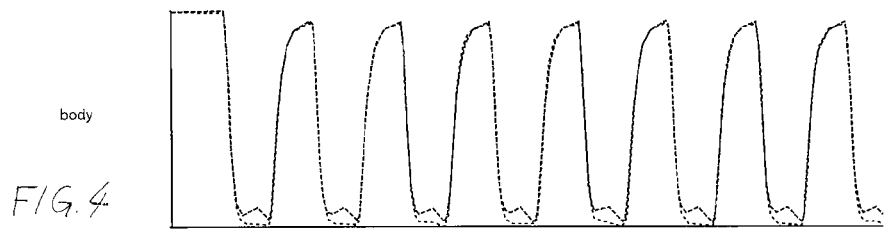
FIG. 4 is a voltage waveform illustrating differences in the body voltage $V_{body}$ of SOI sense amplifiers during a sense operation.

FIG. 4 illustrates variations in body voltage between two floating body FETs 101 and 102 as a function of voltage, shown by two dashed lines. It will be seen that because the input voltage levels of the gate, source and drain nodes at each of the FETs 101 and 102 are almost identical, any variation in body voltage, and thus variation in threshold voltage Vth, is small and does not significantly impact on sense amplifier performance.

Broad Scope of the Invention

While illustrative embodiments of the invention have been described herein, the present invention is not limited to the various illustrative embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims (e.g., including that to be later added) are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example;" and "NB" which means "note well" (nota bene).

What is claimed is:

1. A sense amplifier, comprising:
    first and second CMOS FET inverter pairs, each pair having gate electrodes thereof coupled to a node between FETs of the other pair;
    a sense amplifier enabling FET, which receives a sense amplifier enable signal for enabling a sense operation of the sense amplifier;
    a first sense amplifier input FET, having a first electrode coupled to said first CMOS inverter pair, and a second electrode coupled to said sense amplifier enabling FET; and
    a second sense amplifier input FET, having a first electrode coupled to said second CMOS inverter pair, and a second electrode coupled to said sense amplifier enabling FET;
    wherein said first and second sense amplifier input FETs are floating body FETs, and said first and second CMOS inverter pairs include at least one FET body-tied to ground.

2. The sense amplifier of claim 1, wherein NMOS transistors of said CMOS inverter pairs include body contacts coupling bodies of said NMOS transistors to ground.

3. The sense amplifier of claim 1, wherein said sense amplifier is a silicon-on-insulator (SOI) sense amplifier.

4. The sense amplifier of claim 1, wherein node voltages of said first and second sense amplifier input FETs are substantially identical during a sense operation.

5. The sense amplifier of claim 4, wherein variation between body voltages of said first and second sense amplifier input FETs during a sense operation is relatively small.

6. The sense amplifier of claim 1, wherein said first and second sense amplifier input FETs are NMOS transistors.

7. A method of increasing sense operation speed of a sense amplifier including first and second CMOS FET inverter pairs, each pair having gate electrodes thereof coupled to a node between FETs of the other pair, a sense amplifier enabling FET, which receives a sense amplifier enable signal for enabling a sense operation of the sense amplifier, a first sense amplifier input FET, having a first electrode coupled to said first CMOS inverter pair, and a second electrode coupled to said sense amplifier enabling FET, and a second sense amplifier input FET, having a first electrode coupled to said second CMOS inverter pair, and a second electrode coupled to said sense amplifier enabling FET, comprising the steps of implementing said first and second sense amplifier input FETs as floating body FETs, and implementing at least one of said first and second CMOS FET inverter pairs as FET body-tied to ground.

8. The method of claim 7, wherein NMOS transistors of said CMOS inverter pairs include body contacts coupling bodies of said NMOS transistors to ground.

9. The method of claim 7, wherein said sense amplifier is a silicon-on-insulator (SOI) sense amplifier.

10. The method of claim 7, wherein node voltages of said first and second sense amplifier input FETs are substantially identical during a sense operation.

11. The method of claim 10, wherein variation between body voltages of said first and second sense amplifier input FETs during a sense operation is relatively small.

12. The method of claim 7, wherein said first and second sense amplifier input FETs are NMOS transistors.

* * * * *